United States Patent
Kawahara

(10) Patent No.: US 6,984,565 B2
(45) Date of Patent: Jan. 10, 2006

(54) METHOD OF MANUFACTURING A SEMICONDUCTOR DEVICE

(75) Inventor: Takaaki Kawahara, Ibaraki (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/917,288

(22) Filed: Aug. 13, 2004

(65) Prior Publication Data

US 2005/0048728 A1    Mar. 3, 2005

(30) Foreign Application Priority Data

Aug. 29, 2003 (JP) .............................. 2003-307149
Jun. 25, 2004 (JP) .............................. 2004-187217

(51) Int. Cl.
  *H01L 21/336* (2006.01)

(52) U.S. Cl. ...................................... 438/287; 438/560

(58) Field of Classification Search ................ 438/287, 438/500, 560, 566, 573
See application file for complete search history.

(56) References Cited

U.S. PATENT DOCUMENTS

| 5,576,226 | A | * | 11/1996 | Hwang ........................ 438/275 |
| 5,882,993 | A | * | 3/1999 | Gardner et al. .............. 438/591 |
| 6,475,910 | B1 | | 11/2002 | Sneh |
| 6,479,400 | B2 | | 11/2002 | Suzuki |

FOREIGN PATENT DOCUMENTS

| JP | 2001-274260 | 10/2001 |
| JP | 2003-309188 | 10/2003 |

OTHER PUBLICATIONS

Kawahara et al., "Effect of Purge Time on the Properties of $HfO_2$ Films Prepared by Atomic Layer Deposition", IEICE Trans. Electron., vol. E87-C, No. 1, Jan. 2004.

* cited by examiner

*Primary Examiner*—Phuc T. Dang
(74) *Attorney, Agent, or Firm*—Leydig, Voit & Mayer, Ltd.

(57) ABSTRACT

A first insulating film is formed on a base substrate, then a second insulating film is formed on the first insulating film, the second insulating film having a relative permittivity higher than that of the first insulating film. A gate electrode is formed on the second insulating film. The second insulating film forming includes first to sixth steps, and a cycle consisting of the first to sixth steps is repeated.

18 Claims, 9 Drawing Sheets

(S102~S104)

(S106)

(S110)

(S120)

(S122~S124)

(S126~S130)

(a): Conventional Condition
(b): Long Purge
(c): NH₃/Ar Plasma

METHOD OF MANUFACTURING A SEMICONDUCTOR DEVICE

BACKGROUND OF THE INVENTION

Field of the Invention

The present invention relates to a semiconductor device and a manufacturing method therefor, and more particularly to a semiconductor device including a high dielectric constant insulating film, and a manufacturing method therefor.

In recent years, as semiconductor devices have been miniaturized and hence their integration density has increased, the gate lengths of transistors have been reduced to reduce the power consumption of the semiconductor devices. Accordingly, the gate insulating films have become thinner and thinner to prevent a reduction in the drive current, etc.

Specifically, ITRS (International Technology Roadmap for Semiconductors) has recommended that the "65 nm technical node generation" of semiconductor devices, which will begin to be shipped in 2007, should employ gate insulating films having an EOT (Equivalent Oxide Thickness) between 1.2 nm and 1.6 nm.

However, if a conventional $SiO_2$ gate insulating film is set to an EOT value within the above target range (1.2 nm to 1.6 nm), the tunneling current inevitably increases. Therefore, $SiO_2$ single-layer gate insulating films cannot be used for the 65 nm generation semiconductor devices. To address this problem, research efforts have been made to use high dielectric constant films (hereinafter referred to in the specification as "High-k films") having a higher relative permittivity than $SiO_2$ films as gate insulating films. When a gate insulating film is made up of a High-k film, the film can be set to have a large physical thickness (which suppresses the tunneling current) and a small EOT (which suppresses the power consumption).

A gate insulating film including a High-k film generally has a structure in which the High-k film and an interfacial gate insulating film of SiON, etc. are laminated to each other. In such a case, the interfacial gate insulating film is formed through thermal oxidation, etc. under a nitrogen atmosphere, as is done conventionally. The High-k film, on the other hand, may be formed by a CVD (Chemical Vapor Deposition) technique, sputtering technique, ALD (Atomic Layer Deposition) technique, or the like. However, the ALD technique is preferably used since this technique can grow an extremely uniform film in terms of thickness and composition, capitalizing on the advantages of chemical absorption.

A description will be given of a method for forming an $HfO_2$ film as a High-k film using the ALD technique. First, a substrate having an interfacial gate insulating film formed thereon is put in a film forming apparatus, and TEMAHf (tetrakis(ethylmethylamino)hafnium; $Hf(NEtMe)_4$) in a liquid state is introduced into the apparatus at ambient temperature as a film-forming raw material such that a monomolecular layer is chemically absorbed to the substrate. Then, after purging TEMAHf from the film forming apparatus, $H_2O$ is supplied as an oxidizer so as to expose the substrate to $H_2O$. After that, $H_2O$ is purged from the film forming apparatus. The above four steps, that is, the supply and purge of TEMAHf and the supply and purge of $H_2O$, constitute one formation cycle. This cycle is repeated a plurality of times to form an $HfO_2$ film.

However, a High-k film, such as an $HfO_2$ film, formed by an ALD technique contains a large amount of impurities attributed to its raw material. Specifically, the present inventor analyzed an $HfO_2$ film formed at a temperature of 300° C. by an ALD technique using the film-forming raw material $HfCl_4$ and the oxidizer $H_2O$, and found Cl (chlorine) at a concentration of approximately $2\times10^{21}$ atoms/cm$^3$, H (hydrogen) at approximately $2\times10^{20}$ atoms/cm$^3$, and C (carbon) at approximately $1\times10^{21}$ atoms/cm$^3$ as impurities. Further, an $Al_2O_3$ film formed using the film-forming raw material TMA (trimethylaluminum; $Al(CH_3)_3$) and the oxidizer $H_2O$ was found to contain H (hydrogen) at a concentration of approximately $2\times10^{21}$ atoms/cm$^3$ and C (carbon) at a concentration of approximately $8\times10^{19}$ atoms/cm$^3$ as impurities. Cl contained within the $HfO_2$ film and C contained within the $HfO_2$ film and the $Al_2O_3$ film existed predominantly at the $HfO_2$/Si surface or the $Al_2O_3$/Si surface. If a gate insulating film contains a large amount of impurities, the leakage current increases. Further, if a large amount of impurities is present at the interfaces, interfacial levels are formed, reducing the mobility.

To reduce the amount of impurities in the High-k film (to some degree), the prior Japanese Patent application No. 2002-273765 has proposed a method which also employs the above four steps (such as the supply and purge of the film-forming raw material TEMAHf and the supply and purge of the oxidizer $H_2O$) but performs the fourth step of purging the oxidizer for a longer period of time (this method is hereinafter referred to as a "long purge" method).

By using the above "long purge" method in which the step of purging the oxidizer is performed for an extended period of time, the present inventor was able to reduce the concentrations of the impurities Cl and H in an $HfO_2$ film to approximately $2\times10^{20}$ atoms/cm$^3$ and $1\times10^{20}$ atoms/cm$^3$, respectively. The present inventor has also reduced the concentrations of the impurities H and C in an $Al_2O_3$ film to approximately $2\times10^{20}$ atoms/cm$^3$ and $4\times10^{19}$ atoms/cm$^3$, respectively. That is, the above "long purge" method can reduce the concentrations of the impurities by a factor of 2 to 10, suppressing the leakage current.

Usually, a large amount of C exists at the interface between a High-k film, such as an $HfO_2$ film or an $Al_2O_3$ film, and Si. However, when the above 4-step cycle is repeated, the above "long purge" method may be applied to the initial 10 to 20 cycles or so and the ordinary method (employing a conventional length of purge time) may be applied to the remaining cycles to reduce the amount of C at the interface to the same level as the impurity level within the film. This arrangement also can prevent a reduction in the mobility due to formation of the interfacial level.

Another proposed method for reducing the amount of impurities in the High-k film (to some degree) is to employ eight steps such as the supply and purge of a film-forming raw material, the supply and purge of $H_2$ radicals, the supply and purge of $O_2$ radicals, and the supply and purge of $H_2$ radicals. These steps collectively constitute one cycle, and this cycle is repeated a plurality of times. According to this method, $H_2$ radicals and $O_2$ radicals are supplied such that OH groups are generated on the substrate surface, enabling the film-forming raw material to be smoothly absorbed to the substrate surface. Furthermore, after supplying the film-forming raw material, its ligands can be removed, which makes it possible to form a High-k film having good characteristics (see, for example, U.S. Pat. No. 6,475,910).

However, even though the "long purge" method can reduce the amount of impurities to some degree as described above, the High-k film still contains impurities such as H, C, and Cl at concentrations approximately between $1\times10^{19}$ and $2\times10^{20}$ atoms/cm$^3$. Presence of such impurities leads to the problem of increased leakage current, as described above. For example, SiON films, which have been used as gate insulating films, contain impurities only on the order of (a few) ppm or less. This means that High-k films have a much lower purity than SiON films. Therefore, it is desired to further reduce the amount of impurities in the High-k film to enhance the purity.

Further, the technique proposed in the above U.S. Pat. No. 6,475,910 is disadvantageous in that the oxidizer is limited to oxygen radicals; there are not many such oxidizers for the manufacturing process.

It is, therefore, an object of the present invention to provide a method for manufacturing a semiconductor device which includes a High-k film containing only a small amount of impurities, while overcoming the above problem.

SUMMARY OF THE INVENTION

According to one aspect of the present invention, in a method for manufacturing a semiconductor device, a first insulating film is formd on a semiconductor substrate. A second insulating film is formed on the first insulating film, the second insulating film having a relative permittivity higher than that of the first insulating film. A gate electrode is formed on the second insulating film. The second insulating film forming step includes a first step to a sixth step as following. In the first step a source gas is supplied to a film forming apparatus so as to cause a raw material to be absorbed to a surface of the first insulating film. In the second step excessive source gas is purged from the film forming apparatus by an inert gas. In the third step an oxidizing gas is supplied to the film forming apparatus to oxidize the raw material absorbed to the surface of the first insulating film. In the fourth step excessive source gas is purged from the film forming apparatus by an inert gas. In the fifth step reducing gas plasma is generated within the film forming apparatus to produce active species, and causing the produced active species to react with an unoxidized portion of the raw material absorbed to the surface of the first insulating film. In the sixth step excessive source gas is purged from the film forming apparatus by an inert gas. The first to sixth steps are repeated.

According to another aspect of the present invention, in a method for manufacturing a semiconductor device, a first insulating film is formed on a semiconductor substrate. A second insulating film is formed on the first insulating film, the second insulating film having a relative permittivity higher than that of the first insulating film. A gate electrode is formed on the second insulating film. The second insulating film forming step includes a first step to sixth step as following. In the first step a source gas is supplied to a film forming apparatus so as to cause a raw material to be absorbed to a surface of the first insulating film. In the second step excessive source gas is purged from the film forming apparatus by an inert gas. In the third step an oxidizing gas is supplied to the film forming apparatus to oxidize the raw material absorbed to the surface of the first insulating film. In the fourth step excessive source gas is purged from the film forming apparatus by an inert gas. In the fifth step reducing gas plasma is generated within the film forming apparatus to produce active species, and causing the produced active species to react with an unoxidized portion of the raw material absorbed to the surface of the first insulating film. In the sixth step excessive source gas is purged from the film forming apparatus by an inert gas. The first to sixth steps are repeated n times and then the first to fourth steps are repeated until the second insulating film is formed to a predetermined film thickness, where n is an integer equal to or less than 10.

According to other aspect of the present invention, in a method for manufacturing a semiconductor device, a first insulating film is formed on a semiconductor substrate. A second insulating film is formed on the first insulating film, the second insulating film being made up of a mixed film consisting of two or more types of insulating films, one of the two or more types of insulating films having a relative permittivity higher than that of the first insulating film. A gate electrode is formed on the second insulating film. The second insulating film forming step includes a first step to twelfth step as following. In the first step a first source gas is supplied to a film forming apparatus so as to cause a first raw material to be absorbed to a surface of the first insulating film. In the second step excessive source gas is purged from the film forming apparatus by an inert gas. In the third step a first oxidizing gas is supplied to the film forming apparatus to oxidize the first raw material absorbed to the surface of the first insulating film. In the fourth step excessive source gas is purged from the film forming apparatus by an inert gas. In the fifth step first reducing gas is generated plasma within the film forming apparatus to produce first active species, and causing the produced first active species to react with an unoxidized portion of the first raw material absorbed to the surface of the first insulating film. In the sixth step excessive source gas is purged from the film forming apparatus by an inert gas. In the seventh step a second source gas is supplied to the film forming apparatus so as to cause a second raw material to be absorbed to a surface of the oxidized first raw-material. In the eighth step excessive source gas is purged from the film forming apparatus by an inert gas. In the ninth step a second oxidizing gas is supplied to the film forming apparatus to oxidize the second raw material absorbed to the surface of the first raw material. In the tenth step excessive source gas is purged from the film forming apparatus by an inert gas. In the eleventh step second reducing plasma is generated within the film forming apparatus to produce second active species, and causing the produced second active species to react with an unoxidized portion of the second raw material absorbed to the surface of the first raw material. In the twelfth step excessive source gas is purged from the film forming apparatus by an inert gas. The first to twelfth steps are repeated.

According to other aspect of the present invention, in a method for manufacturing a semiconductor device, a first insulating film is formed on a semiconductor substrate. A second insulating film is formed on the first insulating film, the second insulating film being made up of a mixed film consisting of two or more types of insulating films, one of the two or more types of insulating films having a relative permittivity higher than that of the first insulating film. A gate electrode is formed on the second insulating film. The second insulating film forming step includes a first step to twelfth step as following. In the first step a first source gas is supplied to a film forming apparatus so as to cause a first raw material to be absorbed to a surface of the first insulating film. In the second step excessive source gas is purged from the film forming apparatus by an inert gas. In the third step a first oxidizing gas is supplied to the film forming apparatus to oxidize the first raw material absorbed to the surface of the first insulating film. In the fourth step excessive source gas is purged from the film forming apparatus by an inert gas. In the fifth step first reducing gas plasma is generated to produce first active species, and causing the produced first active species to react with an unoxidized portion of the first raw material absorbed to the surface of the first insulating film. In the sixth step excessive source gas is purged from the film forming apparatus by an inert gas. In the seventh step a second source gas is supplied to the film forming apparatus so as to cause a second raw material to be absorbed to a surface of the oxidized first raw material. In the eighth step excessive source gas is purged from the film forming apparatus by an inert gas. In the ninth step a second oxidizing gas is supplied to the film forming apparatus to oxidize the second raw material absorbed to the surface of the first raw material. In the tenth step excessive source gas is purged from the film forming apparatus by an inert gas. In the eleventh step second reducing gas plasma is generated to produce second active species, and causing the produced second active species to react with an unoxidized portion of the second raw material absorbed to the surface of the first raw material. In the twelfth step excessive source gas is purged from the film forming apparatus by an inert gas. The first to sixth steps are repeated a certain number of times and then the seventh to twelfth steps are repeated.

According to other aspect of the present invention, a semiconductor device comprises a semiconductor substrate, a first insulating film formed on the semiconductor substrate, a second insulating film formed on the first insulating film, the second insulating film having a relative permittivity higher than that of the first insulating film, a gate electrode formed on the second insulating film, a third insulating film formed on sides of the gate electrode, and a source/drain diffusion layer formed in the semiconductor substrate. The carbon concentration of the second insulating film is lower than the nitrogen concentration of the second insulating film.

Other and further objects, features and advantages of the invention will appear more fully from the following description.

DETAILED DESCRIPTION OF THE PREFERRED EMBODIMENTS

Preferred embodiments of the present invention will be described below with reference to the accompanying drawings. It should be noted that in these figures, like or corresponding components are denoted by like numerals to simplify or omit their explanation.

First Embodiment

According to a first embodiment of the present invention, a method for manufacturing a semiconductor device comprises the steps of: forming a first insulating film on a semiconductor substrate; forming a second insulating film on the first insulating film, the second insulating film having a relative permittivity higher than that of the first insulating film; and forming a gate electrode on the second insulating film.

Further according to the first embodiment, the second insulating film forming step includes: a first step of supplying a source gas (or a raw material gas) to a film forming apparatus so as to cause a raw material to be adsorbed to a surface of the first insulating film; a second step of purging excessive first source gas from the film forming apparatus by an inert gas; a third step of supplying an oxidizing gas to the film forming apparatus to oxidize the raw material adsorbed to the surface of the first insulating film; a fourth step of purging excessive first source gas from the film forming apparatus by an inert gas; a fifth step of generating reducing gas plasma within the film forming apparatus to produce active species, and causing the produced active species to react with an unoxidized portion of the raw material adsorbed to the surface of the first insulating film; and a sixth step of purging excessive first source gas from the film forming apparatus by an inert gas; wherein the first to sixth steps are repeated.

Figure 1:
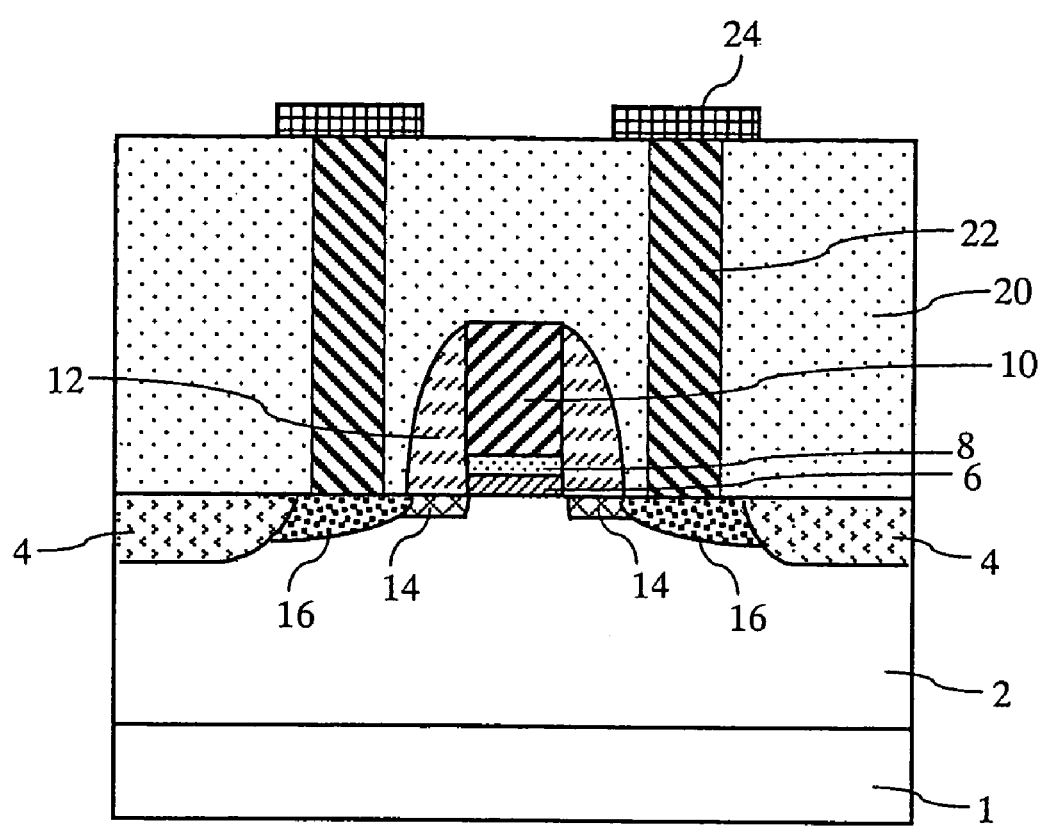
FIG. 1 is a schematic cross-sectional view of a transistor according to the first embodiment.

FIG. 1 is a schematic cross-sectional view of a transistor according to the first embodiment of the present invention.

In the transistor, impurities are implanted in a Si substrate 1, forming a diffusion layer 2, as shown in FIG. 1. Further, above the region of the Si substrate 1 separated by device separation regions 4 are formed a first gate insulating film 6, a second insulating film 8, and a gate electrode 10 in that order. The first gate insulating film 6 is an interfacial gate insulating film of SiON. The second gate insulating film 8 is a thin film made up of a high dielectric constant film (High-k film) of $HfO_2$, etc. The gate electrode 10 is formed of poly-silicon. A sidewall 12 is formed on the sides of the gate electrode 10. The sidewall 12 is made of $Si_3N_4$.

SD extensions 14, which are layers having a relatively low impurity concentration, are formed in the surface portion of the Si substrate 1 such that they extend outside of the gate electrode 10. Furthermore, a source/drain 16, which is a diffusion layer having a relatively large junction depth and a high impurity concentration, is also formed in the surface portion of the Si substrate 1 such that it extends outside of the SD extensions (outside of the sidewall 12).

Further, an isolation dielectric film 20 is deposited on the Si substrate 1 such that the gate electrode 10, the sidewall 12, etc. are buried in the isolation dielectric film 20. Furthermore, contact plugs 22 are formed in the isolation dielectric film 20 such that they penetrate through the isolation dielectric film 20 to the source/drain 16. Further, a wiring layer 24 is formed on the contact plugs 22.

The transistor of the first embodiment is configured as described above. It has the same structure as that of conventional transistors. However, according to the first embodiment, the second gate insulating film 8, which is a High-k film, has a lower impurity content than conventional High-k films. Especially, the amount of C contained in the second gate insulating film 8 is smaller than the amount of N.

Figure 2:
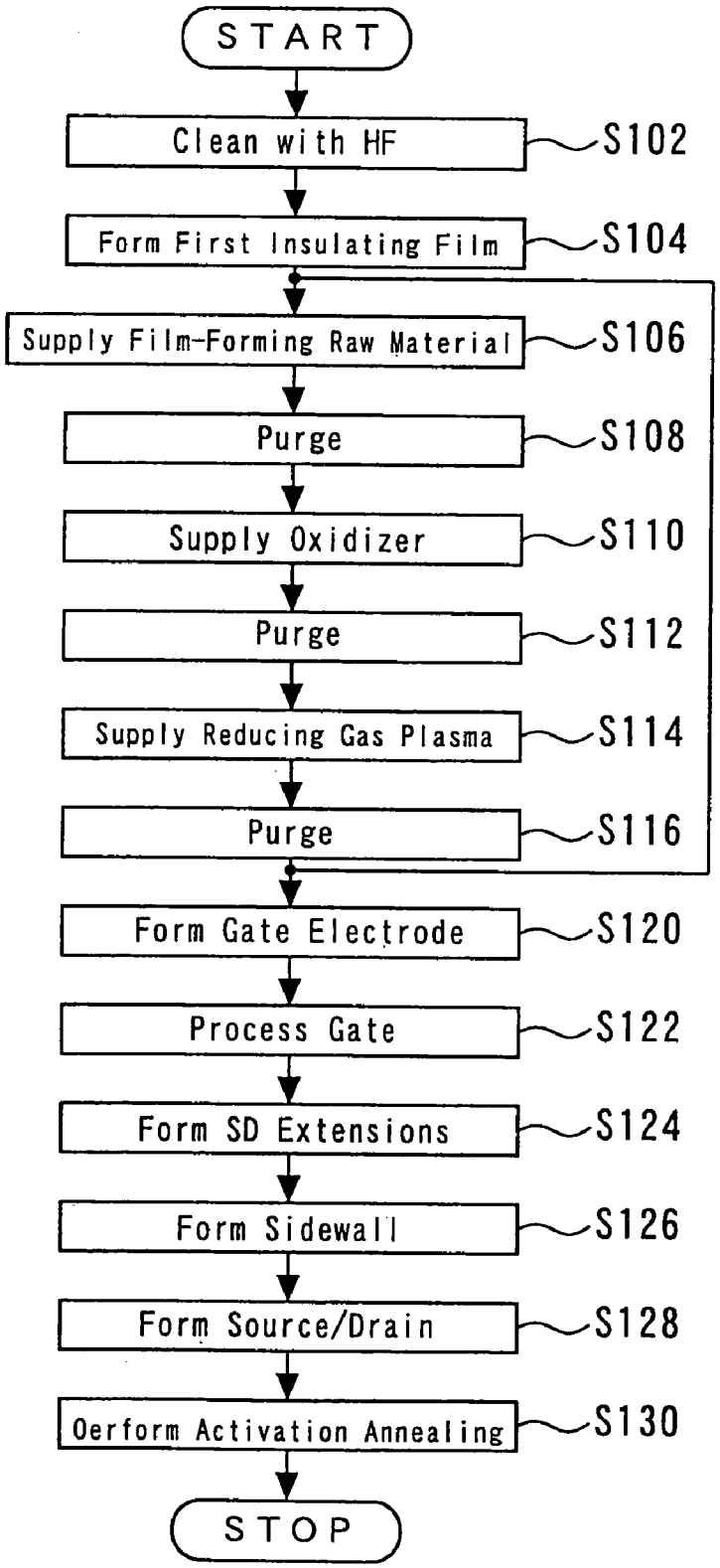
FIG. 2 is a flowchart illustrating a method for manufacturing a transistor according to the first embodiment.

FIG. 2 is a flowchart illustrating a method for manufacturing a transistor according to the first embodiment of the present invention. FIGS. 3 to 8 are schematic cross-sectional views illustrating each step of the method for manufacturing the transistor.

A description will be given below of the method for manufacturing the transistor according to the first embodiment of the present invention with reference to FIGS. 1 to 8.

Figure 3:
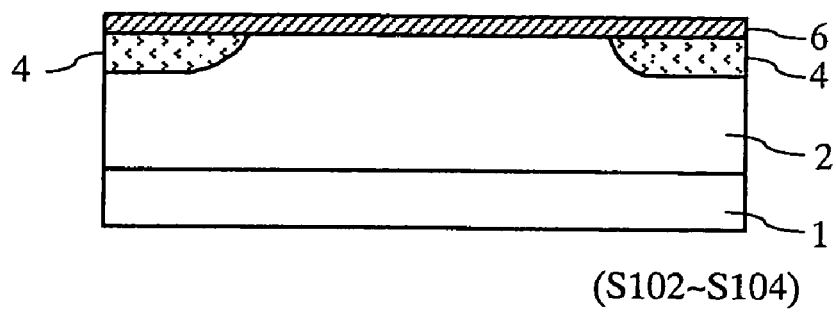
FIGS. 3 to 8 are schematic cross-sectional views illustrating each step of a method for manufacturing a transistor according to the first embodiment.

First of all, impurities are implanted in the Si substrate 1, forming the diffusion layer 2, and then the device separation regions 4 are formed in the Si substrate 1 to separate each region of the Si substrate 1. After that, the surface of the Si substrate 1 is cleaned through HF cleaning in step S102. After the cleaning step, an SiON film used as a material for the first gate insulating film 6 is formed on the Si substrate 1 in step S104, as shown in FIG. 3. The first gate insulating film 6 is formed of $N_2$ and $N_2O$.

Then, for example, an $HfO_2$ film used as a material for the second gate insulating film 8 is formed. Specifically, the $HfO_2$ film (the second gate insulating film) is formed by repeating a cycle consisting of the supply and purge of a film-forming raw material for the second gate insulating film (steps S106 and S108), the supply and purge of an oxidizer (steps S110 and S112), and the supply and purge of active species (steps S114 and S116).

Figure 4:
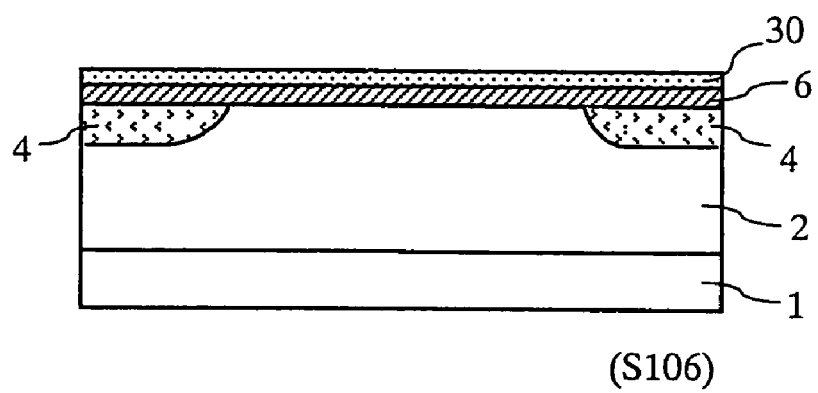
Figure 5:
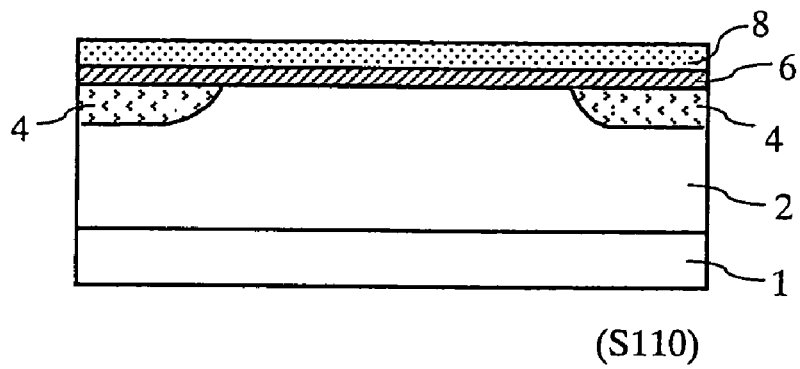

Specifically, in step S106, as a film-forming raw material 30 for the second insulating film, TEMAHf (tetrakis(ethylmethylamino)hafnium; $Hf(NEtMe)_4$) is supplied to a film forming apparatus (not shown) in which the substrate having the first gate insulating film 6 formed thereon has been placed. This causes a monomolecular layer of the film-forming raw material 30 to be chemically absorbed to the surface of the first insulating film 6, as shown in FIG. 4. Then, TEMAHf is purged from the film forming apparatus in step S108. After that, $H_2O$ is supplied to the film forming apparatus as an oxidizer in step S110 without interruption. This causes (the monomolecular layer of) TEMAHf to react with $H_2O$, forming a thin $HfO_2$ film (the second gate insulating film) 8, as shown in FIG. 5. Then, $H_2O$ is purged from the film forming apparatus in step S112.

Then, $NH_3$/Ar plasma is generated within the film forming apparatus to produce active species in step S114. After that, the active species are purged from the film forming apparatus in step S116.

Thus, the above six steps (i.e., the supply and purge of TEMAHf in steps S106 and S108, the supply and purge of $H_2O$ in steps S110 and S112, and the supply and purge of ammonia radicals in steps S114 and S116) constitute one formation cycle, and this cycle is repeated a plurality of times.

It should be noted that the $HfO_2$ film 8 is formed at a film formation rate of approximately 0.8 Å/cycle. Therefore, when an $HfO_2$ film having a certain film thickness needs to be formed, the cycle may be repeated the number of times calculated from the film thickness. Thus, the $HfO_2$ film (the second gate insulating film) 8 having any desired film thickness can be formed.

Figure 6:
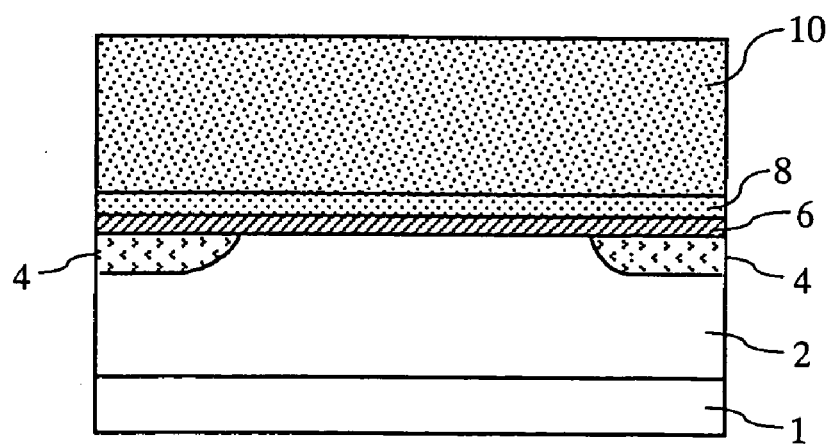
Figure 7:
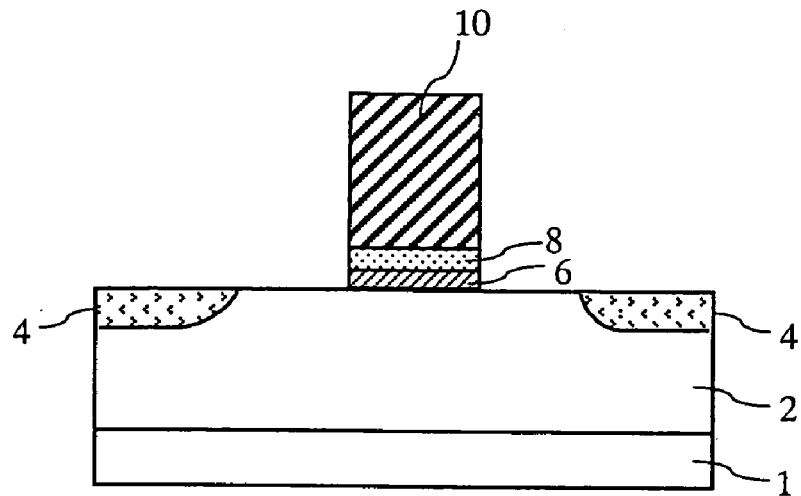

Then, a poly-silicon film 6 used as a material for the gate electrode 10 is deposited on the second gate insulating film ($HfO_2$ film) 8 in step 120, as shown in FIG. 6. Specifically, the poly-silicon film (gate electrode) 10 is formed by a CVD (Chemical Vapor Deposition) technique. Then, in step S122, the poly-silicon film (gate electrode) 10 is processed through lithographic and etching processes such that it has a predetermined gate length, as shown in FIG. 7. At that time, the second gate insulating film ($HfO_2$ film) 8 and the first gate insulating film (SiON film) 6 are also etched such that they have the same width as the gate electrode 10. After that, in step S124, ion implantation is carried out using the gate electrode 10 as a mask to form the SD extensions 14, which are diffusion layers having a relatively small junction depth.

Figure 8:
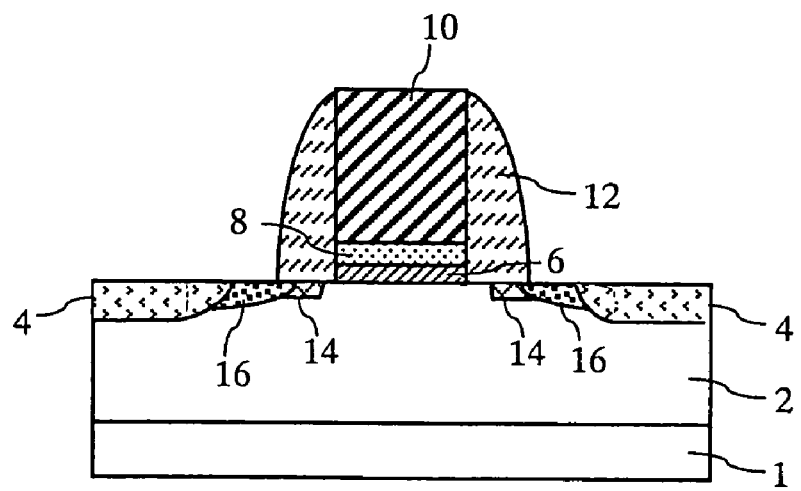

Then, in step S126, the sidewall 12 is formed on the sides of the gate electrode 10, as shown in FIG. 8. Specifically, first an SiN film, etc. is deposited such that the gate electrode 10 is buried in it. Then, the SiN film is etched back so as to leave the SiN film only on the sides of the gate electrode 10, thus forming the sidewall 12.

Then, in step S128, ion implantation is carried out using the gate electrode 10 and the sidewall 12 as a mask to form the source/drain 16 in the surface of the Si substrate 1. The source/drain 16 is a diffusion layer having a high impurity concentration. After that, activation annealing is performed in step S130 to activate the impurities implanted in the SD extensions 14 and the source/drain 16.

Then, an isolation dielectric film 20 is formed on the Si substrate 1 such that the gate electrode 10, the sidewall 12, etc. are buried under the isolation dielectric film 20. Furthermore, the contact plugs 22 are formed in the isolation dielectric film 20 such that they penetrate through the isolation dielectric film 20 to the source/drain 16. After that, the wiring layer 24 is formed on the contact plugs 22.

This completes the process of forming the transistor shown in FIG. 1. After this process, other isolation dielectric films, via plugs, wiring layers, etc. may be formed on the transistor as necessary to form a semiconductor device including the transistor.

Figure 9:
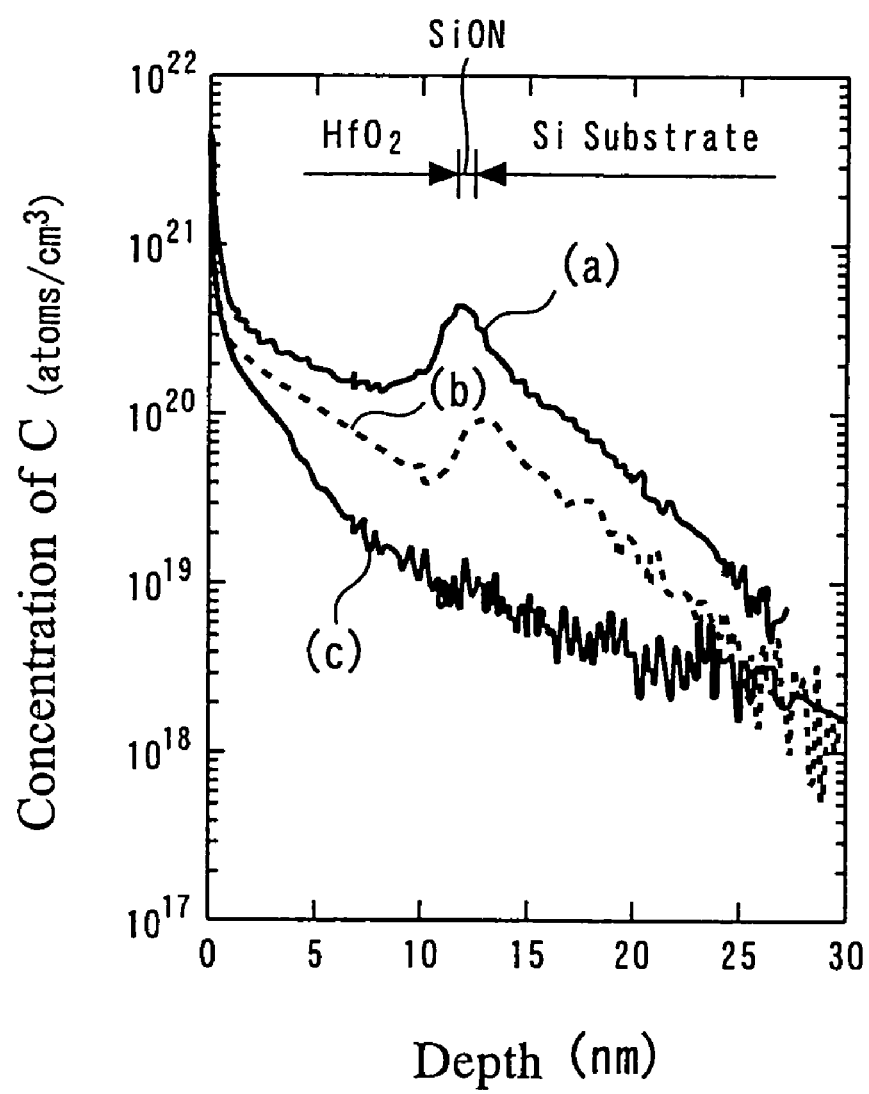
FIG. 9 is a graph showing the carbon contents in a transistor according to the first embodiment.

FIG. 9 is a graph showing the C (carbon) contents of $HfO_2$ films formed by a conventional ALD technique, the above-described "long purge" method, and the above method of the first embodiment, respectively. In the figure, the horizontal axis represents the depth from the surface of each $HfO_2$ film and the vertical axis represents the C concentration (atoms/$cm^3$). Curve (a) indicates the C concentration (content) of the $HfO_2$ film formed by the conventional ALD technique; curve (b) indicates the C concentration of the $HfO_2$ film formed by the "long purge" method; and curve (c) indicates the C concentration of the $HfO_2$ film formed by the method of the present embodiment which includes the step of supplying $NH_3$/Ar plasma.

As shown in FIG. 9, the method of the first embodiment has reduced the C (carbon) content concentration of the $HfO_2$ film at every depth, as compared to the conventional ALD technique and the "long purge" method. Especially, the C concentration around the $HfO_2$/Si interface has been dramatically reduced to approximately $1 \times 10^{19}$ atoms/$cm^3$, as can be seen in the figure. This is considered to be attributed to the fact that in the case of the manufacturing method of the first embodiment including the step of supplying reducing gas plasma, excited radicals (NH, $NH_2$, etc.) formed by the decomposition of $NH_3$ react with Hf—N—$CH_3C_2H_5$ adhered to the surface of the substrate and as a result, C and H are discharged as gas. It should be noted that the N content of the $HfO_2$ film increases as its C content decreases.

Figure 10B:
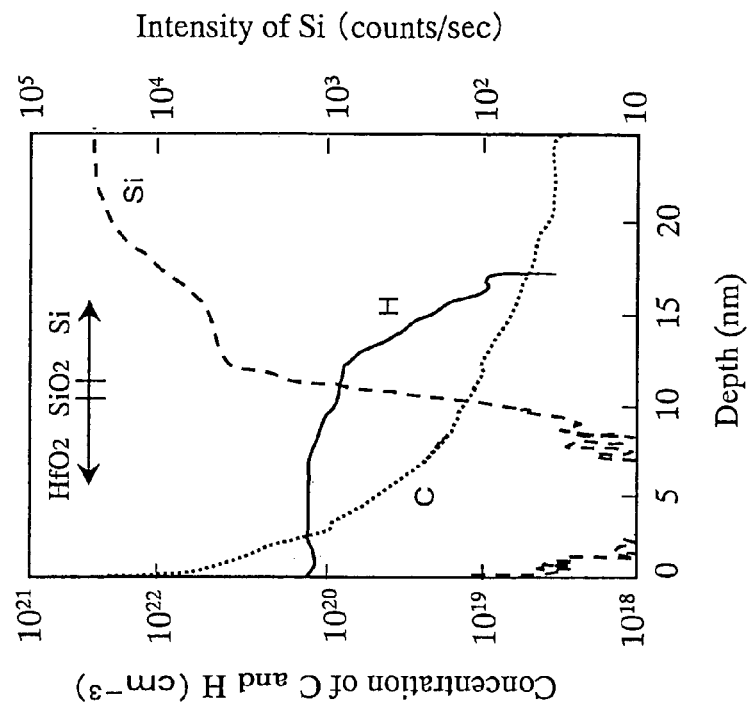
FIG. 10B shows concentration distributions of impurities in a transistor according to the first embodiment.
Figure 10A:
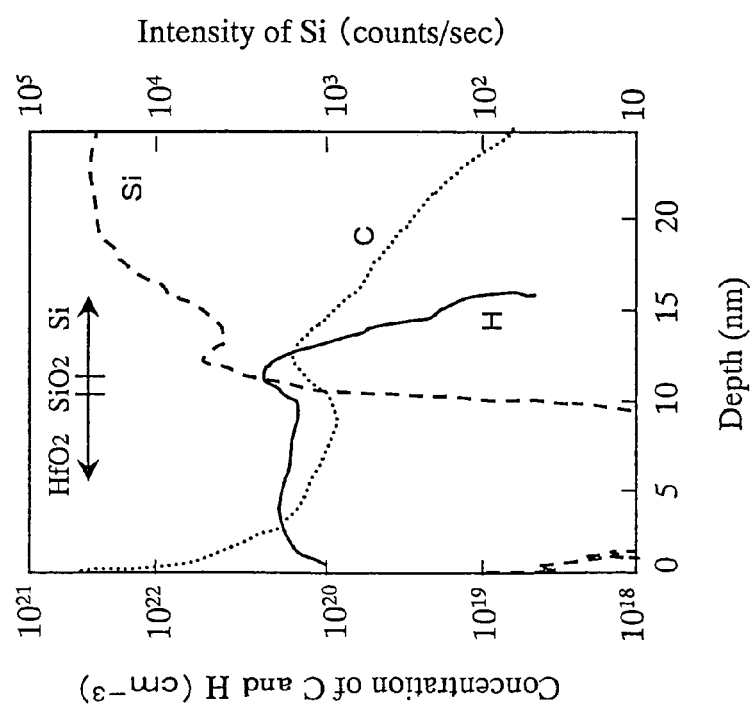
FIG. 10A shows concentration distributions of impurities in the conventional transistor.

FIGS. 10A and 10B show concentration distributions of each impurity. Specifically, FIG. 10A shows concentration distributions obtained when a conventional method is used, while FIG. 10B shows those obtained when the method of the present invention (the first embodiment) is used. As shown in the figures, the method of the present invention (the first embodiment) can reduce the concentrations of H (hydrogen) and N (nitrogen) as well as C. Especially, the impurity concentrations around the $HfO_2/SiO_2$ and the $SiO_2$/Si interfaces have been considerably reduced.

As described above, according to the first embodiment, the process of forming an $HfO_2$ film (High-k film) constituting the second gate insulating film 8 includes steps such as the supply and purge of active species (steps S114 and S116) in addition to the supply and purge of a film-forming raw material (S106 and S108) and the supply and purge of an oxidizer (S110 and S112). The above six steps constitute one cycle, and this cycle is repeated to form the second gate insulating film (HfO$_2$ film) 8. This can reduce the concentrations of impurities such as C contained in the HfO$_2$ film, thereby reducing the leakage current and suppressing the formation of interfacial levels due to the impurities. When a High-k film is formed by a conventional method, its impurity concentration tends to be high at the High-k/Si interface. The first embodiment, however, can effectively prevent an increase in the impurity concentration around the interface, more effectively suppressing the formation of the interfacial levels and preventing a reduction in the mobility. Further according to the method of the first embodiment, the amount of N contained in the HfO$_2$ film increases, which prevents diffusion of Si around the interfaces with the substrate and the poly-Si electrode as well as preventing dopants (e.g., boron, etc.) contained in the poly-Si electrode from diffusing into the High-k film. Therefore, it is possible to produce a semiconductor device having good device characteristics.

Second Embodiment

A second embodiment of the present invention is characterized in that the second embodiment repeats the first to sixth steps of the first embodiment n times and then further repeats the first to fourth steps until the second insulating film is formed to a predetermined film thickness, where n is an integer equal to or less than 10.

Figure 11:
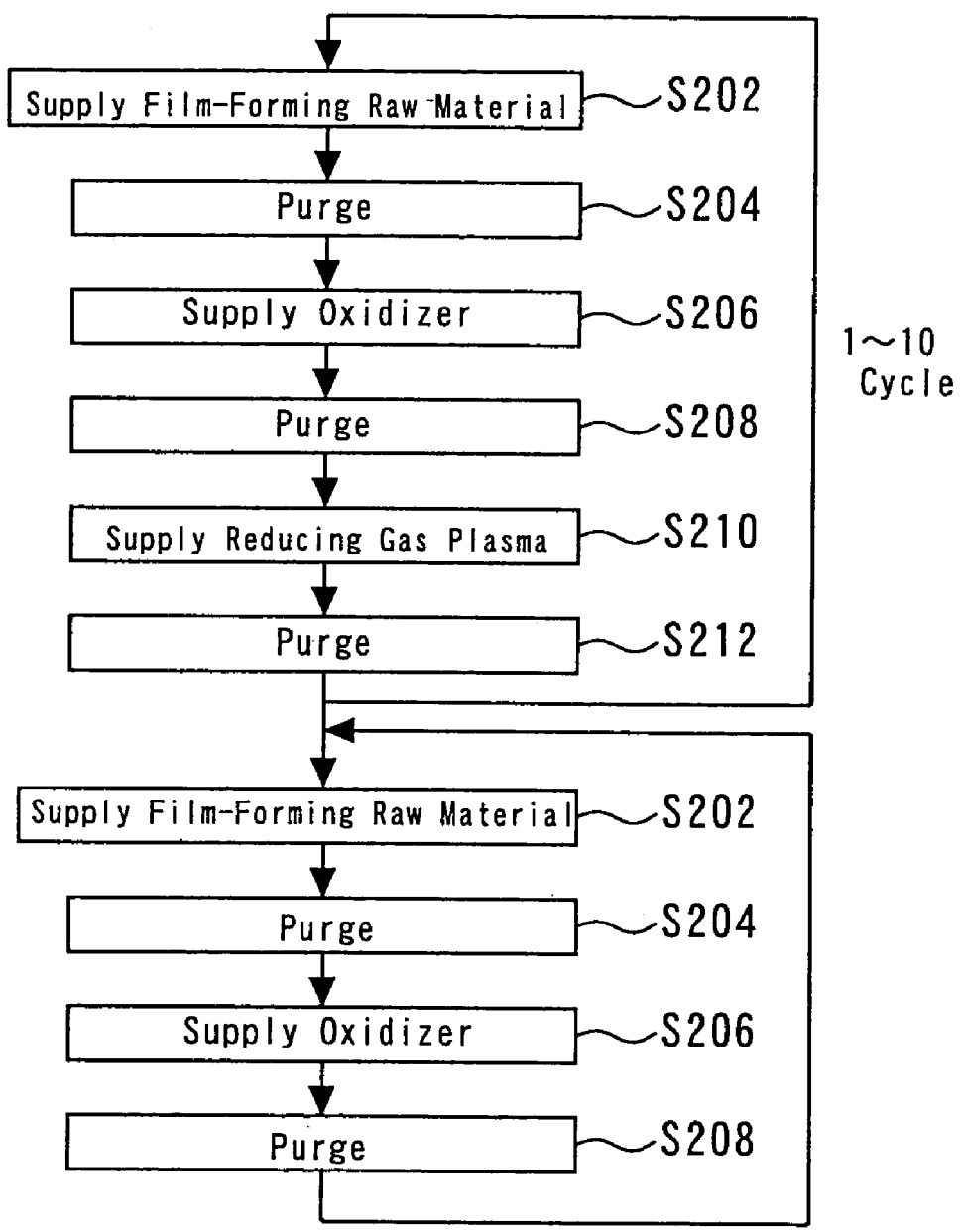
FIG. 11 is a flowchart illustrating a method for manufacturing a transistor according to the second embodiment.

FIG. 11 is a flowchart illustrating a method for forming the second gate insulating film 6 according to the second embodiment of the present invention.

The transistor of the second embodiment has the same structure as the transistor of the first embodiment.

Further, the method of the second embodiment for manufacturing the transistor is almost identical to that of the first embodiment. However, there is the following difference. The process of the first embodiment for forming the second insulating film (HfO$_2$ film) 8 includes 6 steps, namely the supply and purge of a film-forming raw material (steps S106 and S108), the supply and purge of an oxidizer (steps S110 and S112), and the supply and purge of active species (steps S114 and S116). The above 6 steps constitute one cycle, and this cycle is simply repeated to form the second insulating film 8. The method of the second embodiment, on the other hand, first repeats the above 6-step cycle 10 times and then repeats the steps of the conventional ALD method, that is, the supply and purge of the film-forming raw material (steps 202 and S204) and the supply and purge of the oxidizer (steps S206 and S208). Thus, according to the second embodiment, the second insulating film 8 is formed in two stages.

Specifically, first the same 6-step cycle as that of the first embodiment is performed. That is, TEMAHf is supplied to the film forming apparatus as a film-forming raw material in step S202. This causes the film-forming raw material 30 to be absorbed to the Si substrate 1. Then, the film forming apparatus is purged in step S204. After that, H$_2$O is supplied as an oxidizer in step S206 and then it is purged in step S208. Subsequently, ammonia radicals are supplied as reducing gas plasma instep S210 and then they are purged in step S212. This 6-step cycle is repeated 10 times.

According to the second embodiment, after repeating the above 6-step cycle 10 times, the first four steps (S202, S204, S206, and S208) are further repeated. That is, after the 10$^{th}$ cycle, each cycle only consists of the first four steps, i.e., the supply and purge of TEMAHf and the supply and purge of H$_2$O; the supply and purge of the active species (steps S210 and S212) are not performed.

An HfO$_2$ film is formed at a film formation rate of approximately 0.8 Å/cycle. Therefore, when an HfO$_2$ film having a certain film thickness needs to be formed, the cycle may be repeated the number of times calculated from the target film thickness.

After the HfO$_2$ film (the second insulating film) 8 having a desired film thickness is formed, the gate electrode 10, the SD extensions 14, the sidewall 12, the source/drain 16, etc. are formed (steps S122 to S132), as in the first embodiment, forming a semiconductor device similar to that of the first embodiment.

As described above, according to the process of the second embodiment for forming the second gate insulating film (HfO$_2$ film) 8, the first 10 cycles each consists of 6 steps, i.e., the supply and purge of TEMAHf, the supply and purge of H$_2$O, and the supply and purge of active species. After the 10$^{th}$ cycle, however, each cycle includes only 4 steps, i.e., the supply and purge of TEMAHf and the supply and purge of H$_2$O, which is identical to the conventional ALD method. Thus, the second gate insulating film is formed in two stages, and the steps of supplying the active species and purging them are omitted from the second stage. An HfO$_2$ film with a film thickness of 15 nm formed by the above method contains an amount of C approximately equal to that contained in an HfO$_2$ formed by the conventional ALD method. However, the method of the second embodiment can prevent an increase in the amount of C around the HfO$_2$/Si interface, thereby reducing the amount of impurities around the interface, as compared to the conventional ALD technique. Reducing the amount of impurities around the interface can prevent an increase in the leakage current and a reduction in the mobility due to formation of an interfacial level, thereby enhancing the performance of the transistor.

Further according to the process of the second embodiment for forming an HfO$_2$ film, the first 10 cycles each include 6 steps, but the eleventh and later cycles each include only 4 steps identical to the steps of the conventional ALD technique. This arrangement allows producing semiconductor devices having good device characteristics without reducing the throughput.

Since the method of the second embodiment is the same as that of the first embodiment except for the above process, no further explanation will be provided.

The method of the second embodiment first repeats the 6-step cycle (consisting of the supply and purge of a film-forming raw material, the supply and purge of an oxidizer, and the supply and purge of active species) 10 times and then repeats the 4-step cycle (not including the supply and purge of active species) a certain number of times. However, the present invention is not limited to this particular arrangement. The numbers of times the 6-step cycle (which includes the supply and purge of active species) and the 4-step cycle (which does not include the supply and purge of active species) are repeated may be determined considering the film thickness of the film to be formed, the maximum permissible impurity concentrations, etc. Further according to the method of the second embodiment, the steps of supplying active species and purging them are repeated a plurality of times (10 times) in the initial stage, effectively reducing the amount of impurities around the High-k/Si interface. However, the present invention is not limited to this particular arrangement in which only the first several cycles consist of 6 steps. For example, some of the later cycles (4-step cycles) may include the supply and purge of active species.

Further according to the method of the second embodiment, a film formation cycle consists of supplying a film-forming raw material in step S202, purging it in step S204, supplying an oxidizer in step S206, purging it in step S208, supplying active species in step S210, and purging them in step S212. However, the present invention is not limited to this particular cycle. For example, within one cycle, four steps such as the supply and purge of an oxidizer (steps S206 and S208) and the supply and purge of active species (steps S210 and S212) may be repeated a plurality of times after performing the supply and purge of a film-forming raw material (steps S202 and S204). At that time, the above four steps (i.e., the supply and purge of the oxidizer and the supply and purge of the active species) are preferably repeated 1 to 10 times. Further, the supply and purge of active species (steps S210 and S212) may be repeated a plurality of times within one cycle consisting of the supply and purge of a film-forming raw material (steps 202 and 204), the supply and purge of an oxidizer (steps 206 and 208), and the supply and purge of the active species (steps 210 and 212). In such a case, the supply and purge of the active species are preferably repeated approximately 10 times. This arrangement can more effectively prevent impurities from accumulating around the interfaces.

Third Embodiment

According to a third embodiment of the present invention, a method for manufacturing a semiconductor device comprises the steps of: forming a first insulating film on a semiconductor substrate; forming a second insulating film on the first insulating film, the insulating film being made up of a mixed film consisting of two or more types of insulating films, one of the two or more types of insulating films having a relative permittivity higher than that of the first insulating film; and forming a gate electrode on the second insulating film.

Further according to the third embodiment, the second insulating film forming step includes: a first step of supplying a first source gas (or a first raw material gas) to a film forming apparatus so as to cause a first raw material to be absorbed to a surface of the first insulating film; a second step of purging excessive first source gas from the film forming apparatus by an inert gas; a third step of supply a first oxidizing gas to the film forming apparatus to oxidize the first raw material absorbed to the surface of the first insulating film; a fourth step of purging excessive first source gas from the film forming apparatus by an inert gas; a fifth step of generating first reducing gas plasma within the film forming apparatus to produce first active species, and causing the produced first active species to react with an unoxidized portion of the first raw material absorbed to the surface of the first insulating film; a sixth step of purging excessive first source gas from the film forming apparatus by an inert gas; a seventh step of supplying a second source gas (or a second raw material gas) to the film forming apparatus so as to cause a second raw material to be absorbed to a surface of the oxidized first raw material; an eighth step of purging excessive first source gas from the film forming apparatus by an inert gas; a ninth step of supplying a second oxidizing gas to the film forming apparatus to oxidize the second raw material absorbed to the surface of the first raw material; a tenth step of purging excessive first source gas from the film forming apparatus by an inert gas; an eleventh step of generating second reducing gas plasma within the film forming apparatus to produce second active species, and causing the produced second active species to react with an unoxidized portion of the second raw material absorbed to the surface of the first raw material; and a twelfth step of purging excessive first source gas from the film forming apparatus by an inert gas.

According to the third embodiment, the first to twelfth steps may be sequentially repeated a plurality of times. Or the first to sixth steps may be sequentially repeated a plurality of times and then the seventh to twelfth steps may be sequentially repeated a plurality of times.

Figure 12:
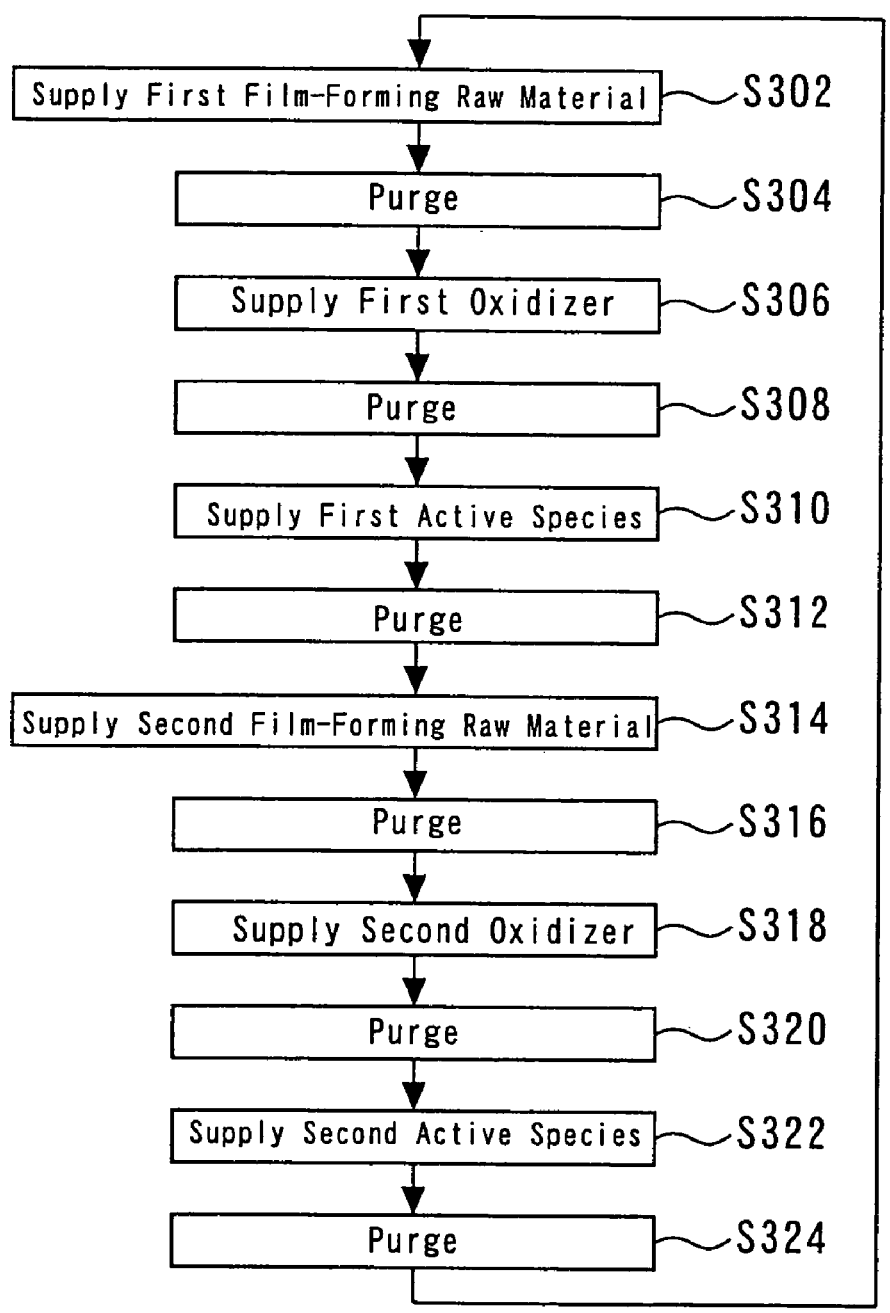
FIG. 12 is a flowchart illustrating a method for manufacturing a transistor according to the third embodiment.

FIG. 12 is a flowchart illustrating the method for forming a transistor according to the third embodiment of the present invention.

The transistor of the third embodiment is almost the same as that of the first embodiment. However, whereas the second gate insulating film 8 of the first embodiment is an $HfO_2$ film, that of the third embodiment is made up of a mixed film consisting of an $HfO_2$ film and an $Al_2O_3$ film.

The method of the third embodiment for manufacturing the transistor is also almost the same as that of the first embodiment. However, as described in detail below, the method of the third embodiment is different from that of the first embodiment in the process of forming the second gate insulating film 8, since they manufacture transistors having different second gate insulating films.

First of all, after forming the first gate insulating film on the substrate in the same manner as in steps S102 to S104 of the first embodiment, the third embodiment performs a first series of 6 steps, namely the supply and purge of a first film-forming raw material (steps S302 and S304), the supply and purge of an oxidizer (steps S306 and S308), and the supply and purge of active species (steps S310 and S312), to form an $HfO_2$ film on the first gate insulating film formed on the substrate. Specifically, first, $HfCl_4$ is supplied to the film forming apparatus as the first film-forming raw material in step S302, causing $HfCl_4$ to be absorbed to the surface of the first gate insulating film. Then, the film forming apparatus is purged in step 304. After that, $H_2O$ is supplied as the oxidizer in step S306. Then, the film forming apparatus is purged in step S308. After that, hydrogen radicals are supplied as the reducer in step S310, and then the film forming apparatus is purged in step S312.

Subsequently, the third embodiment performs a second series of 6 steps, namely the supply and purge of a second film-forming raw material (steps S314 and S316), the supply and purge of an oxidizer (steps S318 and S320), and the supply and purge of active species (steps S322 and S324), to form an $Al_2O_3$ film. Specifically, first, TMA (trimethylaluminum; $Al(CH_3)_3$) is supplied as the second film-forming raw material in step S314, causing TMA to be sufficiently absorbed to the surface of the first film-forming raw material. Then, the film forming apparatus is purged in step S316. After that, $O_2$ radicals are supplied as the oxidizer in step S318. Then, the film forming apparatus is purged in step S320. After that, hydrogen radicals are supplied in step S322, and then the film forming apparatus is purged in step S324.

Then, the process returns to step S302 for supply of the first film-forming raw material.

Steps S302 to S312 for forming $HfO_2$ and steps S314 to S324 for forming $Al_2O_3$ collectively constitute one formation cycle. This cycle is repeated a plurality of times to form an $HfAlO_x$ film as the second insulating film 8, which is a mixed film consisting of an $HfO_2$ film and an $Al_2O_3$ film.

Then, the gate electrode 10, the SD extensions 14, the sidewall 12, the source/drain 16, etc. are formed in the same manner as in the first embodiment, forming the transistor of the third embodiment.

As described above, the third embodiment forms HfAlO$_x$ (film) as the second gate insulating film 8, which is a mixed film consisting of High-k films. Also in this case, the supply and purge of active species are carried out in addition to the conventional 4 steps, i.e., the supply and purge of a film-forming raw material and the supply and purge of an oxidizer. With this arrangement, a High-k film having a low impurity content can be formed, which makes it possible to produce a highly reliable transistor and a semiconductor device having good device characteristics.

Since the method of the third embodiment is the same as those of the first and second embodiment except for the above process, no further explanation will be provided.

It should be noted that in order to form the second gate insulating film 8, the third embodiment performs the supply and purge of a first film-forming raw material (steps S302 and S304), the supply and purge of an oxidizer (steps S306 and S308), and the supply and purge of active species (steps S310 and S312) to form HfO$_2$ and then performs the supply and purge of a second film-forming raw material (steps S314 and S316), the supply and purge of an oxidizer (steps S318 and S320), and the supply and purge of active species (steps S322 and S324) to form Al$_2$O$_3$. These 12 steps constitute one formation cycle, and this cycle is repeated. However, the present invention is not limited to this particular arrangement. For example, the supply and purge of active species may be omitted from either the first half cycle, from the supply of the first film-forming raw material to the purge of the active species (6 steps), or the second half cycle, from the supply of the second film-forming raw material to the purge of the active species (6 steps). Further, for example, the supply and purge of the active species (in steps S310 and S312 or steps S322 and S324) after supplying the first or second film-forming raw material may be repeated a plurality of times within one cycle, as in the second embodiment. Still further, for example, the supply and purge of the oxidizer and the supply and purge of the active species (in steps S306 to S312 or steps S318 to S324) may be repeated a plurality of times within one cycle, as in the second embodiment, which makes it possible to effectively prevent impurities from accumulating around the interfaces.

Still further, as described above, the present embodiment performs the supply and purge of a first film-forming raw material (steps S302 and S304), the supply and purge of an oxidizer (steps S306 and S308), and the supply and purge of active species (steps S310 and S312) once and then performs the supply and purge of a second film-forming raw material (steps S314 and S316), the supply and purge of an oxidizer (steps S318 and S320), and the supply and purge of active species (steps S322 and 5324). However, the present invention is not limited to this particular arrangement. For example, the first half cycle (consisting of the supply and purge of the first film-forming raw material, the supply and purge of the oxidizer, and the supply and purge of the active species in steps S302 to S312, respectively) may be repeated a plurality of times, and then the second half cycle (consisting of the supply and purge of the second film-forming raw material, the supply and purge of the oxidizer, and the supply and purge of the active species in steps S314 to S324, respectively) may also be repeated a plurality of times. The number of times each half cycle is repeated may be adjusted to form a mixed film, or a multilayer film, made up of two or more types of insulating films (or layers) having desired film thicknesses, as the second gate insulating film.

It should be noted that the first to third embodiments were described as applied when a single transistor is formed on the Si substrate 1 and therefore the accompanying drawings only show a single transistor on the Si substrate 1. However, the present invention is not limited to semiconductor devices including only one transistor. They may include a plurality of transistors, such as CMOSFETs (complementary metal-oxide-semiconductor field effect transistors).

Further, the film forming methods of the first to third embodiments can be applied not only when a High-k film is formed as a gate insulating film, but also when other thin films are formed. That is, the present invention is particularly effective in forming High-k films having a low impurity content, metal wiring, etc. for capacitances, wiring, etc. as well as forming gate insulating films.

Still further, the first to third embodiments form an SiON film as the first gate insulating film 6. However, the first gate insulating film 6 of the present invention is not limited to SiON films. The first gate insulating film 6 may be an insulating film having a comparatively low relative permittivity, such as an SiN film or a thermal oxidation film.

Still further, as the second gate insulating film 8, the first and second embodiments form an HfO$_2$ film, which is a High-k film having a higher relative permittivity than the first gate insulating film. However, the second insulating film is not limited to this particular type of High-k film. Another type of High-k film may be used. For example, the second insulating film may be a High-k film made of Sc$_2$O$_3$, Y$_2$O$_3$, La$_2$O$_3$, Pr$_2$O$_3$, Nd$_2$O$_3$, Nb$_2$O$_3$, Sm$_2$O$_3$, EuO, Gd$_2$O$_3$, Tb$_2$O$_3$, Dy$_2$O$_3$, Ho$_2$O$_3$, Er$_2$O$_3$, Tm$_2$O$_3$, Lu$_2$O$_3$, ZrO$_2$, TiO$_2$, MoO$_2$, WO$_2$, MgO, ZnO, SnO, InO, Ta$_2$O$_3$, Al$_2$O$_3$, etc. Similarly, as the second insulating film 8, the third embodiment forms an HfAlO$_x$ film which is a mixed film of HfO$_2$ and Al$_2$O$_3$. However, the second insulating film of the present invention is not limited to this particular type of mixed film. For example, the second insulating film may be a mixed film made up of some of the above High-k films. Furthermore, the second gate insulating film may be a mixed film made up of a High-k film and another type of film, for example, an HfSiO$_x$ film made up of an HfO$_2$ film and an SiO$_2$ film.

Still further, the first to third embodiments use TEMAHf or HfCl$_4$ as a film-forming raw material to form an HfO$_2$ film. However, the HfO$_2$ film-forming raw material of the present invention is not limited to these materials. Examples of the film-forming raw material include Hf(OC(CH$_3$)$_2$ CH$_2$OCH$_3$)$_4$, Hf(OC(CH$_3$)$_3$)$_4$, Hf[N(CH$_3$)$_2$]$_4$, Hf[N(C$_2$H$_5$)$_2$]$_4$, Hf(NO$_3$)$_4$, and Hf (C$_{11}$H$_{19}$O$_2$)$_4$.

Still further, the third embodiment uses TMA to form an Al$_2$O$_3$ film. However, the Al$_2$O$_3$ film-forming raw material of the present invention is not limited to this material.

Still further, as described above, suitable examples of film-forming raw materials for an SiO$_2$ film constituting the second gate insulating film include, but are not limited to, Si(NEtMe)$_4$, Si(OC(CH$_3$)$_3$)$_4$, Si(OC$_2$H$_5$)$_4$, and (C$_2$H$_5$)$_2$SiH$_2$.

Still further, the first to third embodiments use H$_2$O as an oxidizer. However, the oxidizer of the present invention is not limited to H$_2$O. For example, O$_3$, O$_2$, or O$_2$ radicals may be used.

Still further, the first to third embodiments use ammonia radicals or hydrogen radicals as reducing gas plasma. However, the reducer of the present invention is not limited to these radicals. The reducer may be determined considering the film-forming raw material to be used, etc. For example, it may be $N_2$ or a mixed gas radical including $NH_3$, $H_2$, or $N_2$.

It should be noted that the Si substrate 1 of the first to third embodiments in which the device separation regions 4 are formed corresponds to the base substrate (or the semiconductor substrate) of the present invention (indicated in the appended claims).

Further, the mixed film of the third embodiment made up of an $HfO_2$ film and an $Al_2O_3$ film corresponds to the mixed film of the present invention made up of two or more types of insulating films (indicated in the appended claims).

Step S104 of the first to third embodiments corresponds to the first insulating film forming step of the present invention, and steps S120 and S122 of the first to third embodiments together correspond to the gate electrode forming step of the present invention (indicated in the appended claims).

Further, steps of the first and second embodiments correspond to steps of the present invention (indicated in the appended claims) as follows. Steps S106 and S202 correspond to the film-forming raw material supplying step; steps S108 and S204, the film-forming raw material purging step; steps S110 and S206, the oxidizer supplying step; steps S112 and S208, the oxidizer purging step; steps S114 and S210, the active species supplying step; and steps S116 and S212, the active species purging step.

Further, steps of the third embodiment correspond to steps of the present invention (indicated in the appended claims) as follows. Step S302 corresponds to the first film-forming raw material supplying step; step S304, the first film-forming raw material purging step; step S306, the first oxidizer supplying step; step S308, the first oxidizer purging step; step S310, the first reducing gas plasma supplying step; step 312, the first reducing gas plasma purging step; step 314, the second film-forming raw material supplying step; step S316, the second film-forming raw material purging step; step S318, the second oxidizer supplying step; step S320, the second oxidizer purging step; step S322, the second reducing gas plasma supplying step; and step S324, the second reducing gas plasma purging step.

According to the present invention described above, a semiconductor device comprises: a semiconductor substrate; a first insulating film formed on the semiconductor substrate; a second insulating film formed on the first insulating film, the second insulating film having a relative permittivity higher than that of the first insulating film; a gate electrode formed on the second insulating film; a third insulating film formed on sides of the gate electrode; and a source/drain diffusion layer formed in the semiconductor substrate; wherein the carbon concentration of the second insulating film is lower than the nitrogen concentration of the second insulating film. A detailed description will be given below of the effects produced by the above semiconductor device.

A problem arises when a High-k film is formed by a conventional method as the second insulating film in that the material of the High-k film tends to crystallize during heat treatment (usually at approximately 1,000° C.) for activating the source/drain diffusion layer. For example, when an $HfO_2$ film is used as the second insulating film, $HfO_2$ crystallizes due to the above heat treatment. On the other hand, when the second insulating film contains N (nitrogen) or C (carbon), its material hardly crystallizes even during heat treatment. However, since C affects the leakage current more adversely than N, the amount of C is preferably smaller than the amount of N.

According to the present invention, the second insulating film contains N and C, which prevents the material of the High-k film to crystallize due to heat treatment. Furthermore, the carbon (C) concentration of the second insulating film is lower than the nitrogen (N) concentration, preventing an increase in the leakage current. In this case, the N concentration is preferably set to a value small enough not to change the threshold voltage Vth.

The features and advantages of the present invention may be summarized as follows.

As described above, to form the second insulating film having a relative permittivity higher than that of the first insulating film, the present invention performs the supply and purge of active species in addition to the conventional cycle consisting of the supply and purge of a film-forming raw material and the supply and purge of an oxidizer, which makes it possible to reduce the impurity content of the second insulating film. Therefore, it is possible to prevent an increase in the leakage current and thereby produce a semiconductor device having good device characteristics.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-307149, filed on Aug. 29, 2003 including specification, claims, drawings and summary, on which the Convention priority of the present application is based, are incorporated herein by reference in its entirety.

What is claimed is:

1. A method for manufacturing a semiconductor device, comprising:

forming a first insulating film on a semiconductor substrate;

forming a second insulating film on said first insulating film, said second insulating film having a relative permittivity higher than that of said first insulating film; and forming a gate electrode on said second insulating film, wherein forming said second insulating film includes:
a first step of supplying a source gas to a film forming apparatus to cause a raw material to be adsorbed on a surface of said first insulating film;
a second step of purging the source gas from the film forming apparatus with an inert gas;
a third step of supplying an oxidizing gas to said film forming apparatus to oxidize said raw material adsorbed on said surface of said first insulating film;
a fourth step of purging the oxidizing gas from the film forming apparatus with an inert gas;
a fifth step of generating a reducing gas plasma within said film forming apparatus to produce active species, and causing the active species to react with an unoxidized portion of said raw material adsorbed on said surface of said first insulating film;
a sixth step of purging the active species from the film forming apparatus with an inert gas; and
repeating the first to sixth steps.

2. The method for manufacturing a semiconductor device according to claim 1, wherein a cycle consists of performing the first to sixth steps once and then repeating the third to sixth steps n times, where n is an integer not exceeding 10, and including repeating the cycle until said second insulating film is formed to a predetermined thickness.

3. The method for manufacturing a semiconductor device according to claim 1, wherein a cycle consists of performing the first to sixth steps once and then repeating the fifth and sixth steps n times, where n is an integer not exceeding 10, and including repeating the cycle until said second insulating film is formed to a predetermined thickness.

4. A method for manufacturing a semiconductor device, comprising:
forming a first insulating film on a semiconductor substrate;
forming a second insulating film on said first insulating film, said second insulating film having a relative permittivity higher than that of said first insulating film; and
forming a gate electrode on said second insulating film, wherein forming said second insulating film includes:
a first step of supplying a source gas to a film forming apparatus to cause a raw material to be adsorbed on a surface of said first insulating film;
a second step of purging the source gas from the film forming apparatus with an inert gas;
a third step of supplying an oxidizing gas to said film forming apparatus to oxidize said raw material adsorbed on said surface of said first insulating film;
a fourth step of purging the oxidizing gas from the film forming apparatus with an inert gas;
a fifth step of generating a reducing gas plasma within said film forming apparatus to produce active species, and causing the active species to react with an unoxidized portion of said raw material adsorbed on said surface of said first insulating film;
a sixth step of purging the active species from the film forming apparatus with an inert gas; and
repeating the first to sixth steps times and then repeating the first to fourth steps until said second insulating film is formed to a predetermined thickness, where n is an integer not exceeding 10.

5. The method for manufacturing a semiconductor device according to claim 4, wherein a cycle consists of performing the first to sixth steps once and then repeating the third to sixth steps n times, where n is an integer 10, and including repeating the cycle n times and then repeating the first to fourth steps.

6. The method for manufacturing a semiconductor device according to claim 4, wherein a cycle consists of performing the first to sixth steps once and then repeating the fifth and sixth steps n times, where n is an integer not exceeding 10, and including repeating the cycle n times and then repeating the first to fourth steps.

7. A method for manufacturing a semiconductor device, comprising:
forming a first insulating film on a semiconductor substrate;
forming a second insulating film on said first insulating film, said second insulating film including a mixture of at least two insulating films, one of said at least two insulating films having a relative permittivity higher than that of said first insulating film; and
forming a gate electrode on said second insulating film, wherein forming said second insulating film includes:
a first step of supplying a first source gas to a film forming apparatus to cause a first raw material to be adsorbed on a surface of said first insulating film;
a second step of purging the first source gas from the film forming apparatus with an inert gas;
a third step of supplying a first oxidizing gas to said film forming apparatus to oxidize said first raw material adsorbed on said surface of said first insulating film;
a fourth step of purging the first oxidizing gas from the film forming apparatus with an inert gas;
a fifth step of generating a first reducing gas plasma within said film forming apparatus to produce first active species, and causing the first active species to react with an unoxidized portion of said first raw material adsorbed on said surface of said first insulating film;
a sixth step of purging the first active species from the film forming apparatus with an inert gas;
a seventh step of supplying a second source gas to said film forming apparatus to cause a second raw material to be adsorbed on a surface of said first raw material that has been oxidized;
an eighth step of purging the second source gas from the film forming apparatus with an inert gas;
a ninth step of supplying a second oxidizing gas to said film forming apparatus to oxidize said second raw material adsorbed on said surface of said first raw material;
a tenth step of purging the second oxidizing gas from the film forming apparatus with an inert gas;
an eleventh step of generating a second reducing plasma within said film forming apparatus to produce second active species, and causing the second active species to react with an unoxidized portion of said second raw material adsorbed on said surface of said first raw material;
a twelfth step of purging the second active species from the film forming apparatus with an inert gas; and
repeating the first to twelfth steps.

8. The method for manufacturing a semiconductor device according to claim 7, including repeating the first to twelfth steps n times and then repeating the first to fourth steps and the seventh to twelfth steps until said second insulating film is formed to a predetermined thickness, where n is an integer not exceeding 10.

9. The method for manufacturing a semiconductor device according to claim 7, including repeating the first to twelfth steps n times and then repeating the first to sixth steps and the seventh to tenth steps until said second insulating is formed to a predetermined thickness, where n is an integer not exceeding 10.

10. A method for manufacturing a semiconductor device, comprising:
forming a first insulating film on a semiconductor substrate;
forming a second insulating film on said first insulating film, said second insulating film including a mixture of at least two insulating films, one of said at least two insulating films having a relative permittivity higher than that of said first insulating film; and
forming a gate electrode on said second insulating film, wherein forming said second insulating film includes:
a first step of supplying a first source gas to a film forming apparatus to cause a first raw material to be adsorbed on a surface of said first insulating film;
a second step of purging the first source gas from the film forming apparatus with an inert gas;
a third step of supplying a first oxidizing gas to said film forming apparatus to oxidize said first raw material adsorbed on said surface of said first insulating film;
a fourth step of purging the first oxidizing gas from the film forming apparatus with an inert gas;
a fifth step of generating a first reducing gas plasma to produce first active species, and causing the first active species to react with an unoxidized portion of said first raw material adsorbed on said surface of said first insulating film;

a sixth step of purging the first active species from the film forming apparatus with an inert gas;

a seventh step of supplying a second source gas to said film forming apparatus to cause a second raw material to be adsorbed on a surface of said first raw material that has been oxidized;

an eighth step of purging the second source gas from the film forming apparatus with an inert gas;

a ninth step of supplying a second oxidizing gas to said film forming apparatus to oxidize said second raw material adsorbed on said surface of said first raw material;

a tenth step of purging the second oxidizing gas from the film forming apparatus with an inert gas;

an eleventh step of generating a second reducing gas plasma to produce second active species, and causing the second active species to react with an unoxidized portion of said second raw material adsorbed on said surface of said first raw material;

a twelfth step of purging the second active species from the film forming apparatus with an inert gas; and repeating the first to sixth steps a number of times and then repeating the seventh to twelfth steps.

11. The method for manufacturing a semiconductor device according to claim 10, including repeating the first to sixth steps n times and then repeating the first to fourth steps number of times before repeating the seventh to twelfth steps, where n is an integer not exceeding 10.

12. The method for manufacturing a semiconductor device according to claim 10, including repeating first to sixth steps a number of times and then repeating the seventh to twelfth steps n times before repeating the seventh to tenth steps a number of times, where n is an integer not exceeding 10.

13. The method for manufacturing a semiconductor device according to claim 10, wherein a cycle consists of performing the first to sixth steps once and then repeating the third to sixth steps n times, where n is an integer not exceeding 10, and including repeating the cycle a number of times and then repeating the seventh to twelfth steps.

14. The method for manufacturing a semiconductor device according to claim 10, wherein a cycle consists of performing the seventh to twelfth steps once and then repeating the ninth to twelfth steps n times, where n is an integer not exceeding 10, and including repeating the cycle a number of times.

15. The method for manufacturing a semiconductor device according to claim 10, wherein a cycle consists of performing the first to sixth steps once and then repeating the fifth and sixth steps n times, where n is an integer not exceeding 10, and including repeating the cycle a number of times and then repeating the seventh to twelfth steps.

16. The method for manufacturing a semiconductor device according to claim 10, wherein a cycle consists of performing the seventh to twelfth steps once and then repeating the first to twelfth steps n times, where n is an integer not exceeding 10, and including repeating the cycle a number of times.

17. The method for manufacturing a semiconductor device according to claim 1, wherein said second insulating film contains at least one material selected from the group consisting of $SiO_2$, $Sc_2O_3$, $Y_2O_3$, $La_2O_3$, $Pr_2O_3$, $Nd_2O_3$, $Nb_2O_3$, $Sm_2O_3$, $EuO$, $Gd_2O_3$, $Tb_2O_3$, $Dy_2O_3$, $Ho_2O_3$, $Er_2O_3$, $Tm_2O_3$, $Lu_2O_3$, $ZrO_2$, $TiO_2$, $MoO_2$, $WO_2$, $MgO$, $ZnO$, $SnO$, $InO$, $Ta_2O_3$, $HfO_2$, and $Al_2O_3$.

18. The method for manufacturing a semiconductor device according to claim 1, wherein the reducing gas plasma is produced by converting at least one reducing gas into a plasma, the at least one reducing gas being selected from the group consisting of ammonia, hydrogen, and nitrogen.

* * * * *